Nov. 29, 1960 A. F. DANIEL 2,962,539

SOLAR CELL ARRAY

Filed Dec. 2, 1958

INVENTOR,
ARTHUR F. DANIEL

BY Harry M. Saragovitz

ATTORNEY.

United States Patent Office 2,962,539
Patented Nov. 29, 1960

2,962,539

SOLAR CELL ARRAY

Arthur F. Daniel, Fair Haven, N.J., assignor to the United States of America as represented by the Secretary of the Army Filed Dec. 2, 1958, Ser. No. 777,801

1 Claim. (Cl. 136—89)

(Granted under Title 35, U.S. Code (1952), sec. 266)

The invention described herein may be manufactured and used by or for the Government for governmental purposes, without the payment of any royalty thereon.

The present invention relates to a means for packaging cells of the solar type.

With the advent of solar cells, many applications in which such cells can be used have been found. Since the amount of electrical current that can be generated from any array or cluster of solar cells is directly proportional to the amount of cell surfaces exposed to the sunlight, users of such cells have attempted to have as large an exposure of cell surface as feasible. At the present time such cells are mounted and assembled in a rigid framework or support. It has been found that such assembly limits the further application of solar cells to devices other than those that can be effectively operated with only small amounts of electrical current. This is due to the fact that solar cells even when assembled in large clusters generate or supply only a relatively small voltage. To insure an adequate supply of voltage, such as to generate sufficient power to operate an equipment, such a radio receiver and transmitter would entail a framework of assembled cells that would be so large and cumbersome to handle to make such use prohibitive. The handling and transportation of a rigid solar cell framework with an adequate supply of cells for such use has been found to be practically impossible. In other instances it has been found necessary to use power converters to raise the relatively small amount of voltage generated by solar cells to the required voltage for a particular usage.

With the above apparent disadvantages of mounting solar cells in a rigid framework the present invention has as its primary objective the provision of means for mounting a relatively large number of solar cells in a mount or framework that can be reduced to an ultimate relatively small package.

The above objective and features and advantages of the invention will best be understood from the following description to read in view of the accompanying drawing in which.

Figure 1:
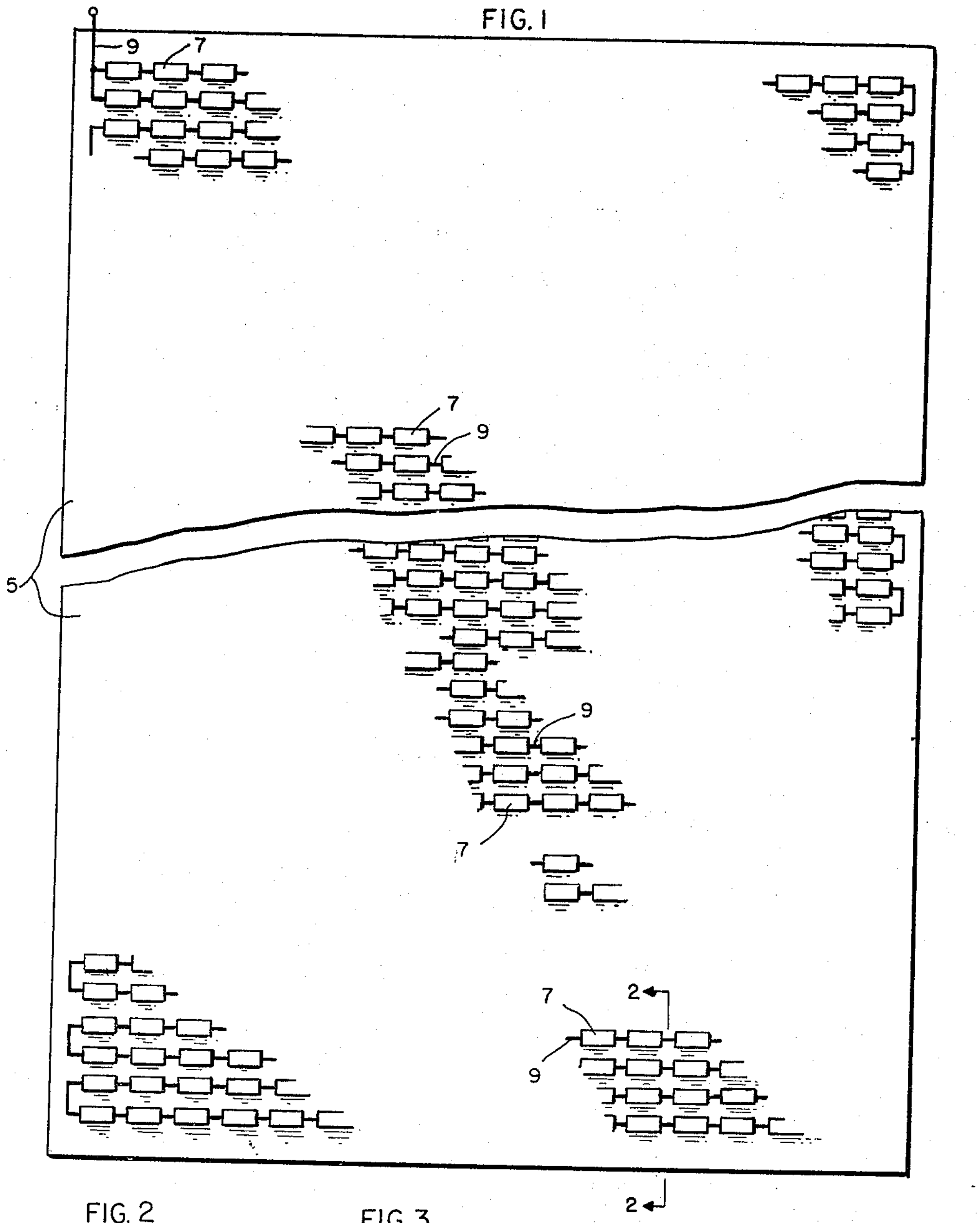
Fig. 1 is a plan view of, showing partially, one embodiment of the invention.

Referring now to the drawing, the means for mounting and packaging the array of solar cells is shown as a sheet or film 5. The sheet 5 is of an extremely pliable and flexible non-conductive material such as nylon, plastic, rubber, cotton cloth, rayon, or the like. The shape or contour of the sheet 5 may be of any design or configuration suited to particular needs. For example, it may assume a normal square configuration of relatively large surface area. In other instances the sheet 5 can be a tent, a tarpaulin, or the like. In any instance it is desirable that the sheet be of a light weight material so as to be easily transportable. Secured by any appropriate means to the surface of the sheet 5 are a plurality of solar cells 7 such as the silicon-boron type. In the embodiment of the invention as shown in Fig. 1 the cells 7 are positioned on the sheet 5 in a fixed definite pattern. In such arrangement thousands of such cells can be contained on a sheet large enough to accommodate such a number. It is to be understood, however, that the cells 7 can be disposed on the sheet in any configuration or array and not dependent upon the shape of the supporting sheet. In the drawing the cells 7 are shown connected in series by means of wires 9. The type of connector used to electrically link the cells, whether in series or parallel, is no part of invention, it being understood, however, that any connecting means utilized must be flexible as is the sheet 5. In lieu of conventional flexible wires as shown at 9, it might be desirable in certain instances to utilize printed circuitry as a means for connecting individual cells. The manner in which the cells 7 are electrically connected forms no part of this invention. Thus, for example, the cells can be connected in parallel, in series or in series-parallel arrangement.

Figure 2:
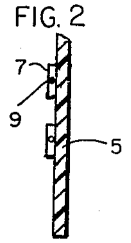
Fig. 2 is a sectional view of the unit shown in Fig. 1.
Figure 3:
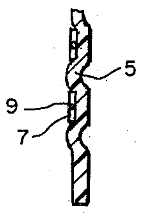
Fig. 3 is a sectional view of another modification of the invention.

In Fig. 3 there is shown a modification of the invention wherein the sheet 5 has a rippled surface area in lieu of the flat surface area of the sheet shown in Fig. 2. In such form the solar cells are positioned in the depressed areas as shown.

The advantageous use of a solar cell packaging and mounting means herein described are believed readily apparent. The packaging means described prior to its use can be rolled, folded, or gathered into a relatively small package. Such package of reduced size can be easily transported from one place to another. Being of reduced bulk a large number of such packaged solar cell arrays can be handled where rigid frameworks holding comparable numbers of cells could not be readily manipulated. When ready for use such reduced size package can be spread out to receive the required activating sunlight.

What is claimed as new is:

A solar cell array comprising a plurality of electrically linked solar cells mounted upon a sheet of relatively large surface area of pliable material having a substantially sinuous cross sectional configuration wherein said cells are contained in the depressed portions of said sheet and so aligned that said sheet can be folded or rolled to size substantially smaller than when said sheet is in unfurled condition.

References Cited in the file of this patent

UNITED STATES PATENTS

| | | |
|---|---|---|
| 452,250 | Williams | May 12, 1891 |
| 999,951 | Bird | Aug. 8, 1911 |
| 2,305,576 | Lamb | Dec. 15, 1942 |
| 2,428,537 | Veszi et al. | Oct. 7, 1947 |
| 2,622,051 | Hermanson et al. | Dec. 16, 1952 |

FOREIGN PATENTS

| | | |
|---|---|---|
| 331,022 | Switzerland | Aug. 15, 1958 |